(12) United States Patent
Terauchi

(10) Patent No.: US 8,117,509 B2
(45) Date of Patent: Feb. 14, 2012

(54) MEMORY CONTROL CIRCUIT, SEMICONDUCTOR INTEGRATED CIRCUIT, AND VERIFICATION METHOD OF NONVOLATILE MEMORY

(75) Inventor: Youji Terauchi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 371 days.

(21) Appl. No.: 12/230,683

(22) Filed: Sep. 3, 2008

(65) Prior Publication Data

US 2009/0063792 A1 Mar. 5, 2009

(30) Foreign Application Priority Data

Sep. 5, 2007 (JP) ................................. 2007-229725

(51) Int. Cl.
*G11C 29/00* (2006.01)
(52) U.S. Cl. ........................................................ 714/718
(58) Field of Classification Search .................. 714/718, 714/763

See application file for complete search history.

(56) References Cited

U.S. PATENT DOCUMENTS

| 4,296,494 | A  | * | 10/1981 | Ishikawa et al. ................... 714/6 |
| 6,931,582 | B2 | * | 8/2005  | Tamura et al. ................. 714/758 |
| 7,447,936 | B2 | * | 11/2008 | Shiota et al. ....................... 714/5 |
| 7,451,368 | B2 | * | 11/2008 | Shibata et al. ................. 714/724 |
| 2006/0259848 | A1 | * | 11/2006 | Blevins .......................... 714/763 |
| 2009/0138783 | A1 | * | 5/2009  | Aoki ............................. 714/764 |

FOREIGN PATENT DOCUMENTS

JP 2000-90675 3/2000

* cited by examiner

*Primary Examiner* — James C Kerveros
(74) *Attorney, Agent, or Firm* — McGinn Intellectual Property Law Group, PLLC

(57) ABSTRACT

A memory control circuit includes a conversion circuit performing a conversion processing for parallel readout bit data formed from individual bits read out from memory cells of a nonvolatile memory, by setting the individual bit that is once again read out from the memory cell, which is previously determined to be successfully storing an expectation value, to a corresponding expectation value expected to be stored in the memory cell, and a determination circuit determining a result of a write processing to write parallel expectation value data to the nonvolatile memory, based on the parallel readout bit data converted by the conversion circuit and the parallel expectation value data.

26 Claims, 14 Drawing Sheets

| INPUT a | INPUT b | OUTPUT c |
|---|---|---|
| RS1 | sWS1 | gWS1 |
| 0 | 0 | 1 |
| 0 | 1 | 1 |
| 1 | 0 | 0 |
| 1 | 1 | 1 |

Fig. 7

| INPUT a | INPUT b | INPUT c | OUTPUT d |
|---|---|---|---|
| gWS1 | WS1 | RS1 | gRS1 |
| 0 | 0 | 0 | 0 |
| 1 | 0 | 0 | 0 |
| 0 | 1 | 0 | 0 |
| 0 | 0 | 1 | 1 |
| 1 | 1 | 0 | 0 |
| 0 | 1 | 1 | 1 |
| 1 | 0 | 1 | 0 |
| 1 | 1 | 1 | 1 |

Fig. 8

| PARALLEL EXPECTATION VALUE DATA WS | 01010101 |
|---|---|
| PARALLEL READ DATA RS OF FIRST TIME | 01111101 |
| PARALLEL READ DATA RS OF SECOND TIME | 01010111 |
| CONVERTED PARALLEL READ DATA cRS | 01010101 |

Fig. 10

CHART FOR EXPLAINING OPERATION OF DATA SELECTION CIRCUIT

| | FIRST WRITE PROCESSING | SUBSEQUENT WRITE PROCESSING |
|---|---|---|
| | SELECT SIGNAL =L LEVEL | SELECT SIGNAL =H LEVEL |
| SELECTION CIRCUIT 11 | sWS1=WS1 | sWS1=gWS1 |
| SELECTION CIRCUIT 12 | sWS2=WS2 | sWS2=gWS2 |
| SELECTION CIRCUIT 13 | sWS3=WS3 | sWS3=gWS3 |
| SELECTION CIRCUIT 14 | sWS4=WS4 | sWS4=gWS4 |
| SELECTION CIRCUIT 15 | sWS5=WS5 | sWS5=gWS5 |
| SELECTION CIRCUIT 16 | sWS6=WS6 | sWS6=gWS6 |
| SELECTION CIRCUIT 17 | sWS7=WS7 | sWS7=gWS7 |
| SELECTION CIRCUIT 18 | sWS8=WS8 | sWS8=gWS8 |

Fig. 11

CHART FOR EXPLAINING OPERATION OF PARALLEL REWRITE DATA GENERATION CIRCUIT AT FIRST DETERMINATION PROCESSING

|  | INPUT a | INPUT b | OUTPUT c | STATUS OF NEXT WRITE PROCESSING |
|---|---|---|---|---|
| REWRITE DATA GENERATION CIRCUIT 21 | RS1=0 | sWS1=0 | gWS1=1 | MASK |
| REWRITE DATA GENERATION CIRCUIT 22 | RS2=1 | sWS2=1 | gWS2=1 | MASK |
| REWRITE DATA GENERATION CIRCUIT 23 | RS3=1 | sWS3=0 | gWS3=0 | RETRY |
| REWRITE DATA GENERATION CIRCUIT 24 | RS4=1 | sWS4=1 | gWS4=1 | MASK |
| REWRITE DATA GENERATION CIRCUIT 25 | RS5=1 | sWS5=0 | gWS5=0 | RETRY |
| REWRITE DATA GENERATION CIRCUIT 26 | RS6=1 | sWS6=1 | gWS6=1 | MASK |
| REWRITE DATA GENERATION CIRCUIT 27 | RS7=0 | sWS7=0 | gWS7=1 | MASK |
| REWRITE DATA GENERATION CIRCUIT 28 | RS8=1 | sWS8=1 | gWS8=1 | MASK |

Fig. 12

CHART FOR EXPLAINING OPERATION OF PARALLEL READOUT DATA CONVERSION CIRCUIT AT FIRST DETERMINATION PROCESSING

|  | INPUT a | INPUT b | OUTPUT OF AND 1 | INPUT c | OUTPUT d |
|---|---|---|---|---|---|
| READOUT DATA GENERATION CIRCUIT 31 | gWS1=1 | WS1=0 | 1 | RS1=0 | gRS1=0 |
| READOUT DATA GENERATION CIRCUIT 32 | gWS2=1 | WS2=1 | 0 | RS2=1 | gRS2=1 |
| READOUT DATA GENERATION CIRCUIT 33 | gWS3=0 | WS3=0 | 0 | RS3=1 | gRS3=1 |
| READOUT DATA GENERATION CIRCUIT 34 | gWS4=1 | WS4=1 | 0 | RS4=1 | gRS4=1 |
| READOUT DATA GENERATION CIRCUIT 35 | gWS5=0 | WS5=0 | 0 | RS5=1 | gRS5=1 |
| READOUT DATA GENERATION CIRCUIT 36 | gWS6=1 | WS6=1 | 0 | RS6=1 | gRS6=1 |
| READOUT DATA GENERATION CIRCUIT 37 | gWS7=1 | WS7=0 | 1 | RS7=0 | gRS7=0 |
| READOUT DATA GENERATION CIRCUIT 38 | gWS8=1 | WS8=1 | 0 | RS8=1 | gRS8=1 |

Fig. 13

CHART FOR EXPLAINING OPERATION OF DETERMINATION CIRCUIT
AT FIRST DETERMINATION PROCESSING

|  | WS | gRS | DETERMINATION | JS |
|---|---|---|---|---|
| BIT =1 | 0 | 0 | SUCCESS | 0 |
| BIT =2 | 1 | 1 | SUCCESS | |
| BIT =3 | 0 | 1 | FAIL | |
| BIT =4 | 1 | 1 | SUCCESS | |
| BIT =5 | 0 | 1 | FAIL | |
| BIT =6 | 1 | 1 | SUCCESS | |
| BIT =7 | 0 | 0 | SUCCESS | |
| BIT =8 | 1 | 1 | SUCCESS | |

Fig. 14

CHART FOR EXPLAINING OPERATION OF PARALLEL REWRITE DATA GENERATION CIRCUIT
AT SECOND DETERMINATION PROCESSING

|  | INPUT a | INPUT b | INPUT c | STATUS OF NEXT WRITE PROCESSING |
|---|---|---|---|---|
| REWRITE DATA GENERATION CIRCUIT 21 | RS1=0 | sWS1=1 | gWS1=1 | MASK |
| REWRITE DATA GENERATION CIRCUIT 22 | RS2=1 | sWS2=1 | gWS2=1 | MASK |
| REWRITE DATA GENERATION CIRCUIT 23 | RS3=0 | sWS3=0 | gWS3=1 | MASK |
| REWRITE DATA GENERATION CIRCUIT 24 | RS4=1 | sWS4=1 | gWS4=1 | MASK |
| REWRITE DATA GENERATION CIRCUIT 25 | RS5=0 | sWS5=0 | gWS5=1 | MASK |
| REWRITE DATA GENERATION CIRCUIT 26 | RS6=1 | sWS6=1 | gWS6=1 | MASK |
| REWRITE DATA GENERATION CIRCUIT 27 | RS7=1 | sWS7=1 | gWS7=1 | MASK |
| REWRITE DATA GENERATION CIRCUIT 28 | RS8=1 | sWS8=1 | gWS8=1 | MASK |

Fig. 15

CHART FOR EXPLAINING OPERATION OF PARALLEL READOUT DATA CONVERSION CIRCUIT
AT SECOND DETERMINATION PROCESSING

|  | INPUT a | INPUT b | OUTPUT OF AND1 | INPUT c | INPUT d |
|---|---|---|---|---|---|
| READOUT DATA CONVERSION CIRCUIT 31 | gWS1=1 | WS1=0 | 1 | RS1=0 | gRS1=0 |
| READOUT DATA CONVERSION CIRCUIT 32 | gWS2=1 | WS2=1 | 0 | RS2=1 | gRS2=1 |
| READOUT DATA CONVERSION CIRCUIT 33 | gWS3=1 | WS3=0 | 1 | RS3=0 | gRS3=0 |
| READOUT DATA CONVERSION CIRCUIT 34 | gWS4=1 | WS4=1 | 0 | RS4=1 | gRS4=1 |
| READOUT DATA CONVERSION CIRCUIT 35 | gWS5=1 | WS5=0 | 1 | RS5=0 | gRS5=0 |
| READOUT DATA CONVERSION CIRCUIT 36 | gWS6=1 | WS6=1 | 0 | RS6=1 | gRS6=1 |
| READOUT DATA CONVERSION CIRCUIT 37 | gWS7=1 | WS7=0 | 1 | RS7=1 | gRS7=0 |
| READOUT DATA CONVERSION CIRCUIT 38 | gWS8=1 | WS8=1 | 0 | RS8=1 | gRS8=1 |

Fig. 16

CHART FOR EXPLAINING OPERATION OF DETERMINATION CIRCUIT
AT SECOND DETERMINATION PROCESSING

|  | WS | gRS | DETERMINATION | JS |
|---|---|---|---|---|
| BIT =1 | 0 | 0 | SUCCESS | |
| BIT =2 | 1 | 1 | SUCCESS | |
| BIT =3 | 0 | 0 | SUCCESS | |
| BIT =4 | 1 | 1 | SUCCESS | 1 |
| BIT =5 | 0 | 0 | SUCCESS | |
| BIT =6 | 1 | 1 | SUCCESS | |
| BIT =7 | 0 | 0 | SUCCESS | |
| BIT =8 | 1 | 1 | SUCCESS | |

Fig. 17

MEMORY CONTROL CIRCUIT, SEMICONDUCTOR INTEGRATED CIRCUIT, AND VERIFICATION METHOD OF NONVOLATILE MEMORY

BACKGROUND OF THE INVENTION

1. Field of the Invention

The present invention relates to a memory control circuit, a semiconductor integrated circuit, and a verification method of a nonvolatile memory.

2. Description of Related Art

In these years, semiconductor integrated circuits have become increasingly sophisticated in function. In accordance with this trend, there is an increasing demand for semiconductor memory devices sophisticated in function. Note that such a semiconductor memory device may be referred to as a "memory" hereinafter. Note that the semiconductor memory is capable of storing data electrically in an erasable or writable manner.

A nonvolatile memory has been widely known as the memory. In this nonvolatile memory, a write processing to write digital data "0" or "1" is performed by injecting charge carriers to floating gates which are provided in each of memory cells. A read processing to read digital data "0" or "1" is performed by detecting an amount of the charge carriers stored in each floating gate of the memory cells. It is arbitrary which data "1" or "0" corresponds to the charge storage state in the floating gate.

In this nonvolatile memory, a readout processing for reading out stored data is first performed, and then a determination processing for determining whether the readout data matches the write data (expectation value data) is performed. By adopting these processings, the reliability of the stored data is secured. If the readout data is different from the write data, a rewrite processing is performed to rewrite the write data to the same memory cells. In other words, if it is determined that a first write processing is failed, the rewrite processing is performed on the same target memory cells. And then, a second determination processing is performed to determine whether the readout data matches the write data as in the first determination processing. Note that it is frequent to perform the write, rewrite, and determination processings per data of a plurality of bits. Note that the determination processing to determine whether the readout data matches the write data may be sometimes referred to a verification processing.

Incidentally, memory cells aligned in a same column or row are coupled to a common wire (a source wire, for example). Therefore, even though the write processing for a particular memory cell is determined to be successful at the determination processing, an opposite result may be obtained sometimes at the subsequent determination processing after the rewrite processing for the particular memory cell.

In Japanese Unexamined Patent Application Publication No. 2000-90675 (reference 1), a determination level at a determination processing is lowered in accordance with the number of times of write processings to a particular memory. More specifically, a level of threshold voltage used in the determination processing is lowered in accordance with the number of times of the write processings to a particular memory.

In the above reference 1, a voltage applied to the memory cells at the first write processing needs to be set with considering a voltage level for a first determination processing in order to perform the first write and determination processings successfully. That is, the voltage applied to the memory cells at the write processing needs to be set high in accordance with a high threshold voltage used in the first determination processing so as to perform the first write and determination processings successfully. If the high voltage is applied to the memory cell, the quality of an insulate film (insulating film formed immediately below the floating gate) of the memory cell may be deteriorated, and thus the reliability of the nonvolatile memory may be deteriorated.

That is, with the prior art, it has been difficult to suppress an overturn of a determination result without deteriorating the reliability of a nonvolatile memory.

SUMMARY

In one embodiment of the present invention, there is provided a memory control circuit including: a conversion circuit performing a conversion processing for parallel readout bit data formed from individual bits read out from memory cells of a nonvolatile memory, by setting the individual bit that is once again read out from the memory cell, which is previously determined to be successfully storing an expectation value, to a corresponding expectation value expected to be stored in the memory cell; and a determination circuit determining a result of a write processing to write parallel expectation value data to the nonvolatile memory, based on the parallel readout bit data converted by the conversion circuit and the parallel expectation value data.

According to one aspect of the present invention, there is provided a semiconductor integrated circuit including: a nonvolatile memory storing parallel bit data formed from individual bits based on parallel expectation value data that is expected to be stored in the nonvolatile memory and formed from expectation values; and a memory control circuit checking whether the parallel expectation value data is stored in the nonvolatile memory successfully, the memory control circuit including: a conversion circuit converting parallel readout bit data formed from individual bits read out from memory cells of a nonvolatile memory, by setting the individual bit that is once again read out from the memory cell, which is previously determined to be successfully storing the expectation value, to the corresponding expectation value that is expected to be stored in the memory cell; and a determination circuit determining a result of a write processing to write parallel expectation value data to the nonvolatile memory, based on the parallel readout bit data converted by the conversion circuit and the parallel expectation value data.

According to one aspect of the present invention, there is provided a verification method of a nonvolatile memory including: converting parallel readout bit data formed from individual bits read out from memory cells of a nonvolatile memory, by setting the individual bit that is once again read out from the memory cell, which is previously determined to be successfully storing an expectation value, to a corresponding expectation value that is expected to be stored in the memory cell; and determining a result of a write processing to write parallel expectation value data to the nonvolatile memory, based on the parallel readout bit data converted by the conversion circuit and the parallel expectation value data.

It is achieved to suppress an overturn of a determination result without deteriorating a reliability of a nonvolatile memory.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 7 shows a truth chart of a rewrite data generation circuit 21;

FIG. 8 is a truth chart of a readout data conversion circuit 31;

FIG. 10 is a chart showing each parallel data having a plurality of bits;

FIG. 11 is a chart for explaining an operation of a parallel data selection circuit;

FIG. 12 is a chart for explaining an operation of a parallel rewrite data generation circuit at a first determination processing;

FIG. 13 is a chart for explaining an operation of a parallel readout data conversion circuit at the first determination processing;

FIG. 14 is a chart for explaining an operation of a determination circuit at the first determination processing;

FIG. 15 is a chart for explaining an operation of a parallel rewrite data generation circuit at the second determination processing;

FIG. 16 is a chart for explaining an operation of a parallel readout data conversion circuit at the second determination processing; and FIG. 17 is a chart for explaining an operation of a determination circuit at the second determination processing.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
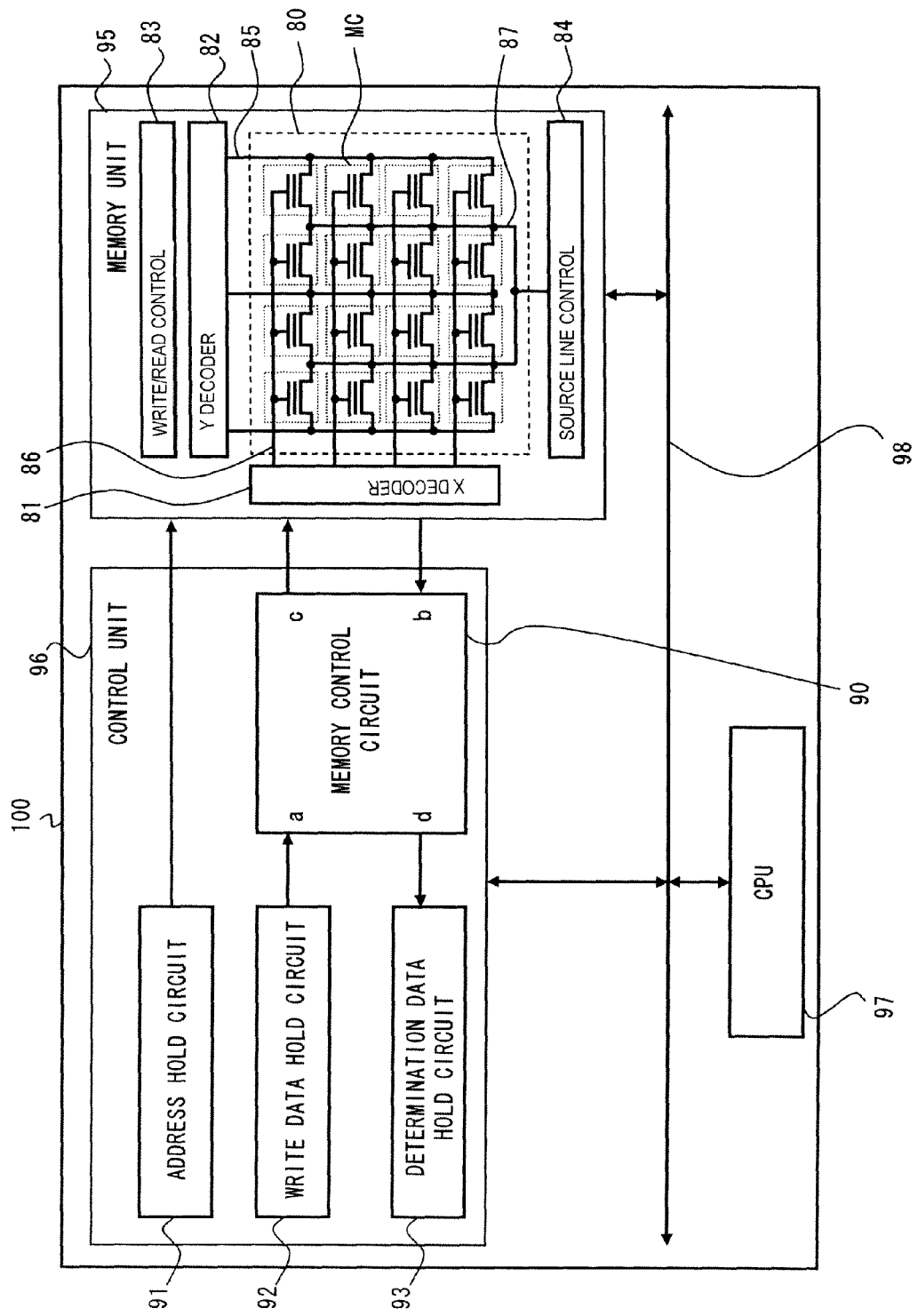
FIG. 1 is a schematic block diagram showing a semiconductor integrated circuit.
Figure 2:
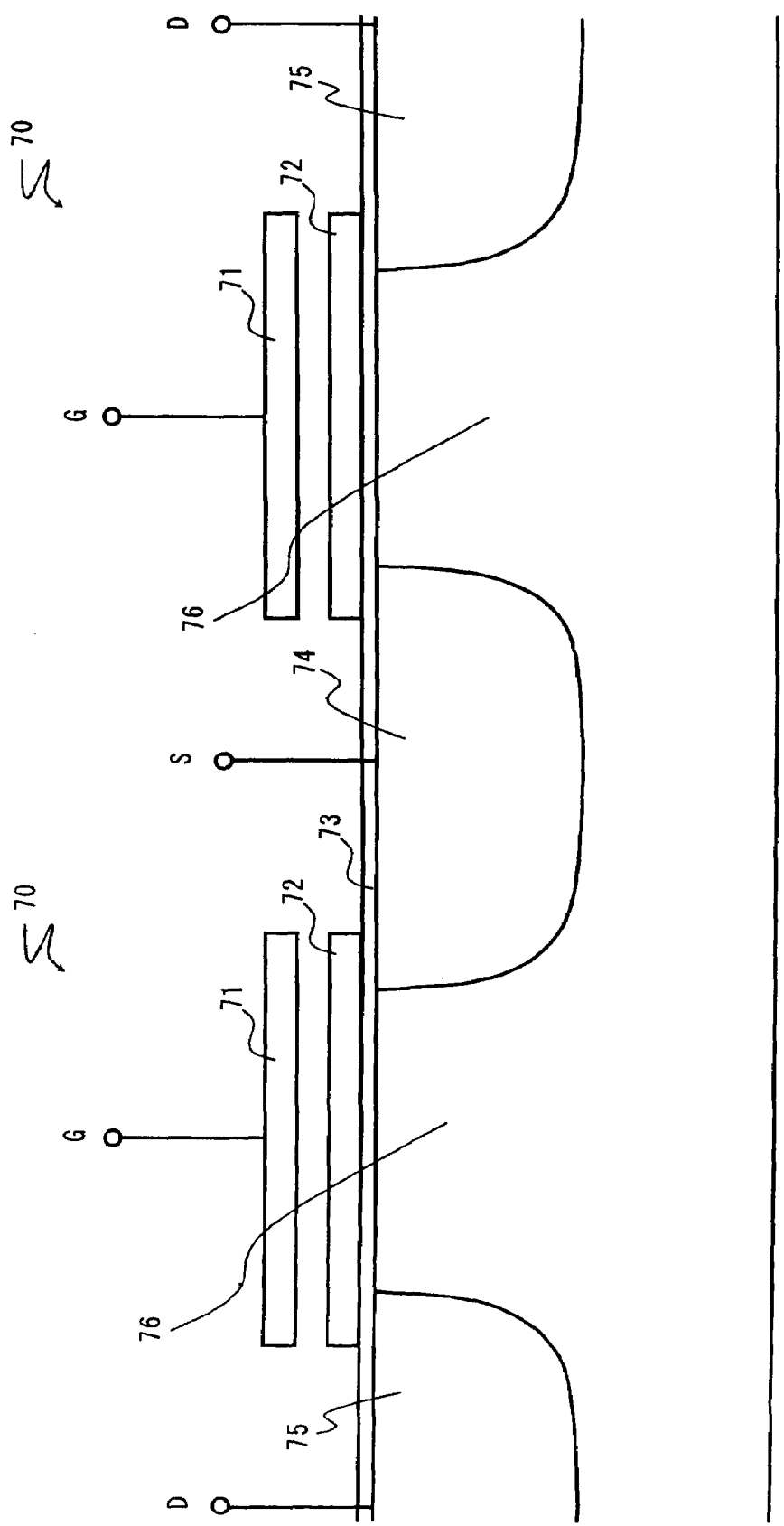
FIG. 2 is a schematic view for explaining a sectional structure of a memory cell MC.
Figure 3:
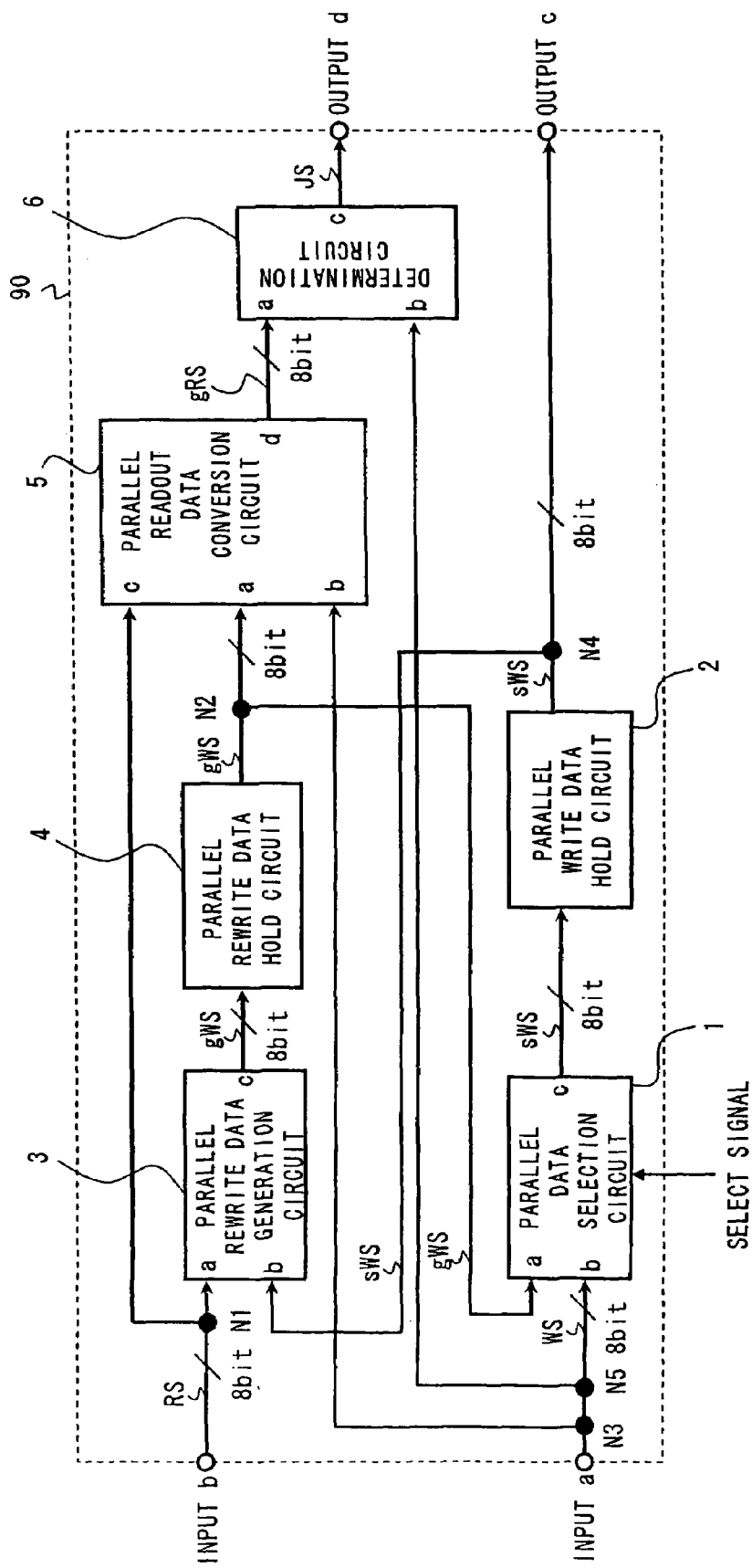
FIG. 3 is a schematic block diagram showing a memory control circuit.
Figure 4:
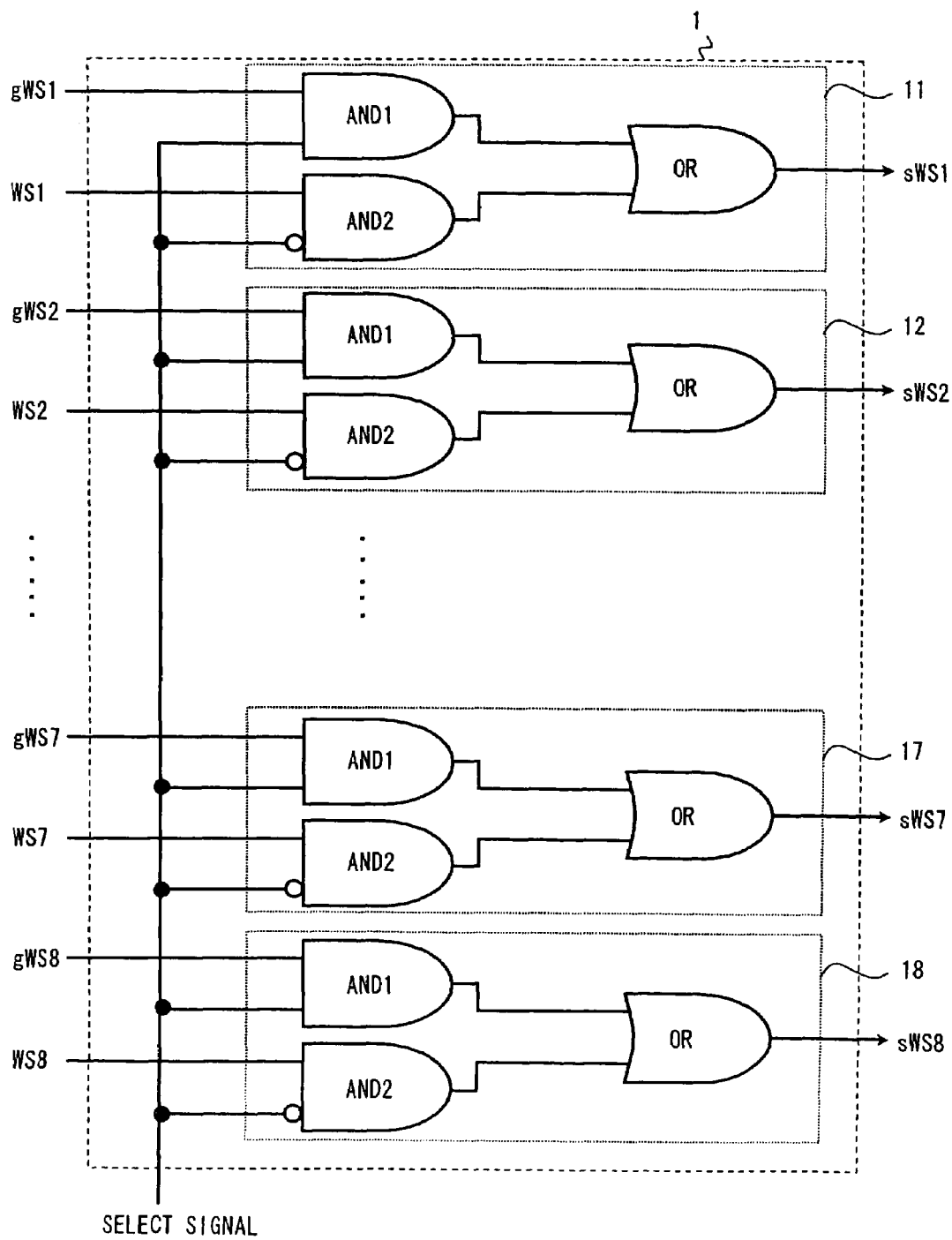
FIG. 4 is a schematic circuit diagram of a parallel data selection circuit.
Figure 5:
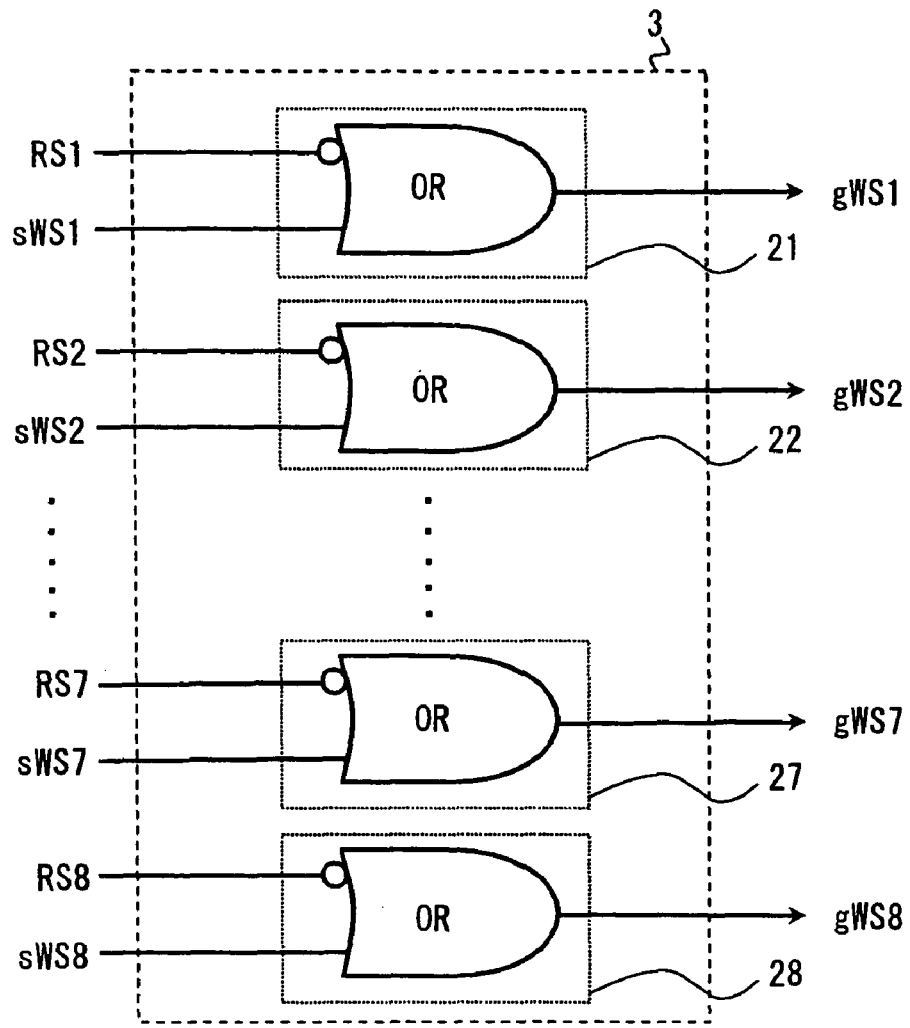
FIG. 5 is a schematic circuit diagram of a parallel rewrite data generation circuit.
Figure 6:
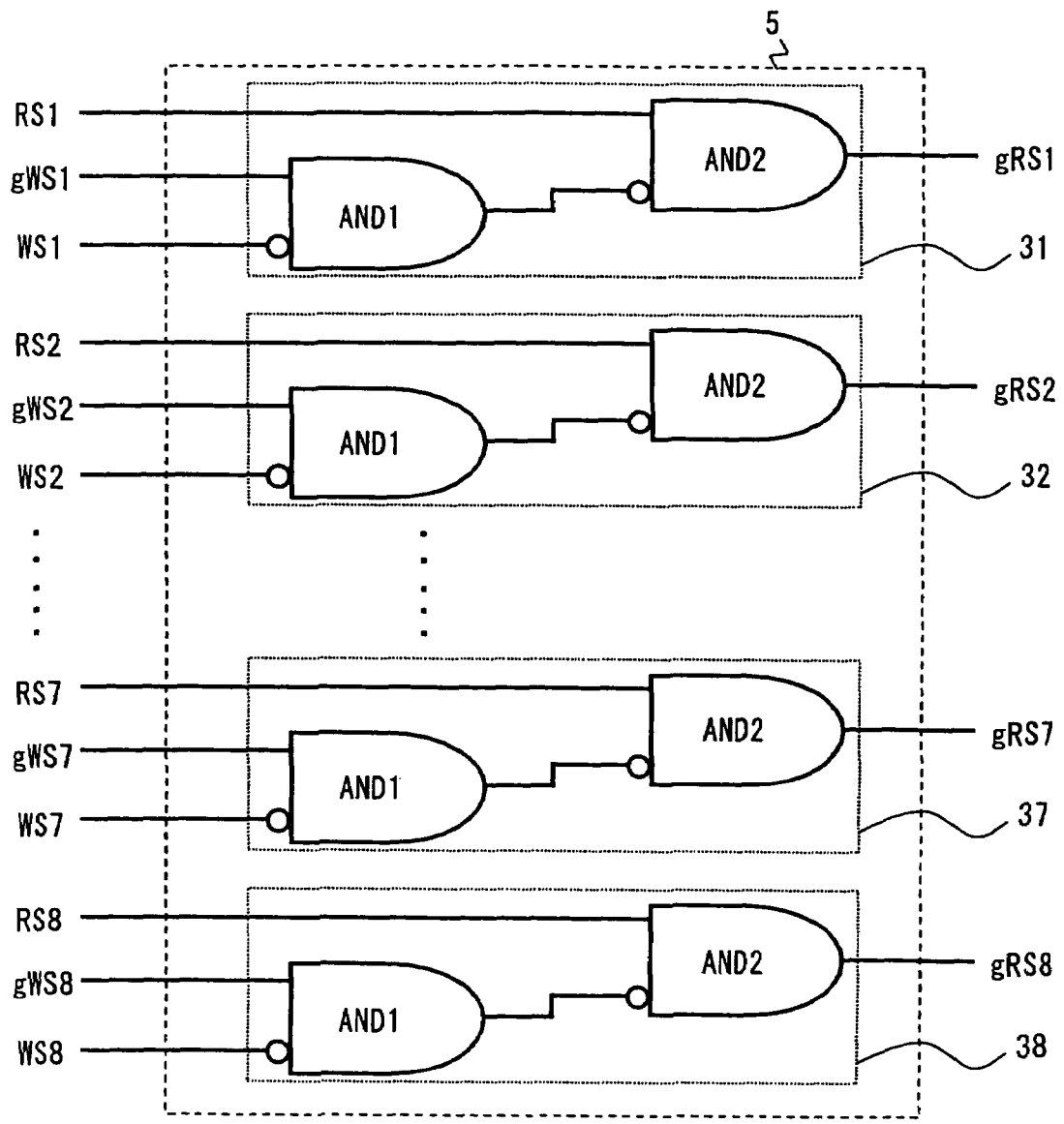
FIG. 6 shows a schematic circuit diagram of a parallel readout data conversion circuit.
Figure 9:
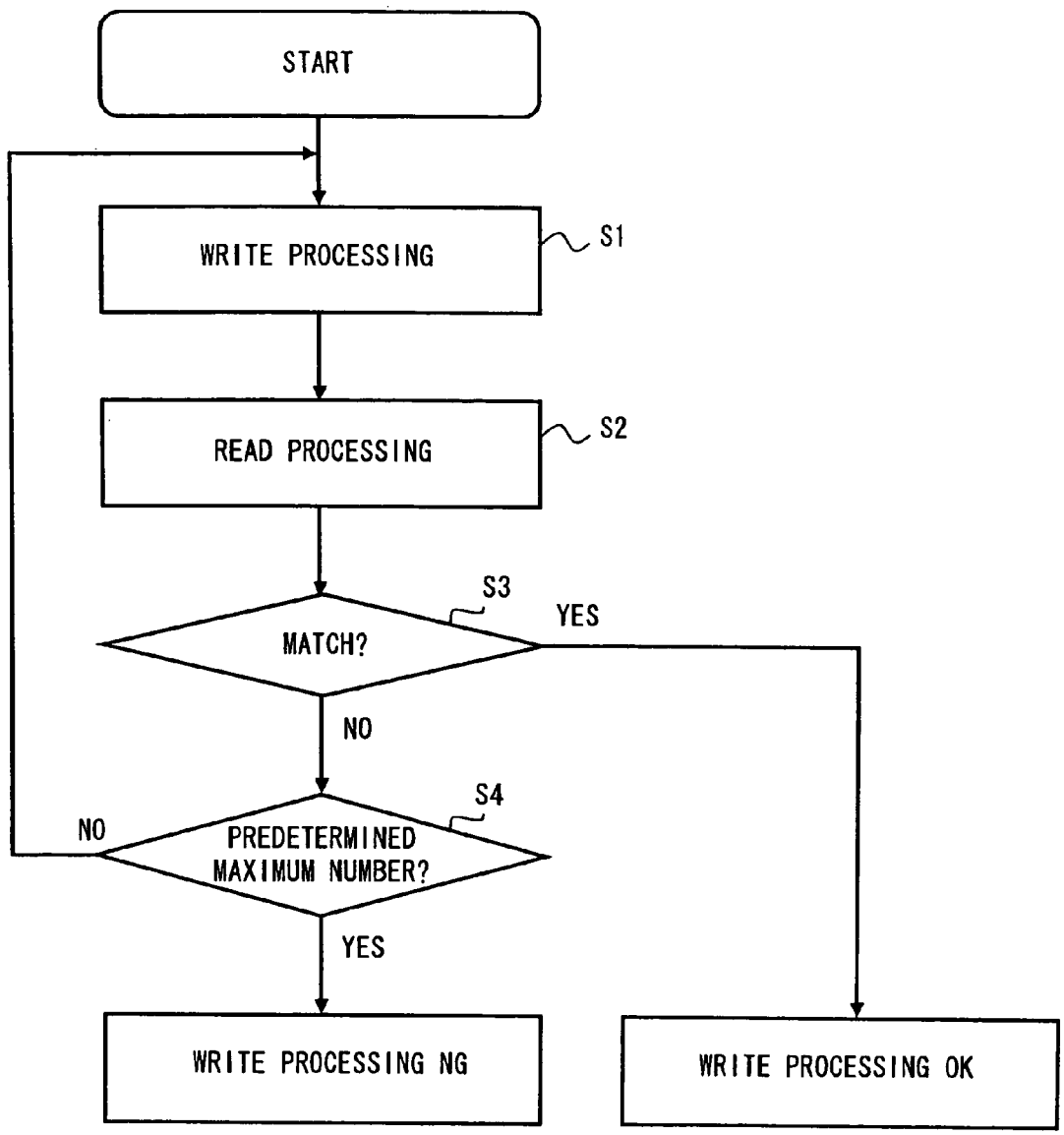
FIG. 9 is a schematic flowchart for explaining a method of controlling a nonvolatile memory.

A first embodiment of this invention is described with reference to FIGS. 1 to 18. FIG. 1 shows a schematic block diagram of a semiconductor integrated circuit. FIG. 2 shows a schematic view for explaining a sectional structure of a memory cell MC. FIG. 3 shows a schematic block diagram showing a memory control circuit. FIG. 4 shows a schematic circuit diagram of a parallel data selection circuit. FIG. 5 shows a schematic circuit diagram of a parallel rewrite data generation circuit. FIG. 6 shows a schematic circuit diagram of a parallel readout data conversion circuit. FIG. 7 shows a truth chart of a rewrite data generation circuit 21. FIG. 8 shows a truth chart of a readout data conversion circuit 31. FIG. 9 shows a schematic flowchart for explaining a method of controlling a nonvolatile memory. FIG. 10 shows a chart showing each parallel data having a plurality of bits. FIG. 11 shows a chart for explaining an operation of a parallel data selection circuit. FIG. 12 shows a chart for explaining an operation of a parallel rewrite data generation circuit at a first determination processing. FIG. 13 shows a chart for explaining an operation of a parallel readout data conversion circuit at the first determination processing. FIG. 14 shows a chart for explaining an operation of a determination circuit at the first determination processing. FIG. 15 shows a chart for explaining an operation of a parallel rewrite data generation circuit at a second determination processing. FIG. 16 shows a chart for explaining an operation of a parallel readout data conversion circuit at the second determination processing. FIG. 17 shows a chart for explaining an operation of a determination circuit at the second determination processing.

As shown in FIG. 1, a semiconductor integrated circuit 100 includes a memory unit (nonvolatile memory) 95, a control unit 96, a central processing unit (CPU) 97, and a bus 98. An output of the control unit 96 is input to the memory unit 95. An output of the memory unit 95 is input to the control unit 96. The control unit 96 is connected to the CPU 97 via the bus 98. In a same way, the memory unit 95 is connected to the CPU 97 via the bus 98. Note that the width of the bus 98 is 8 bit.

As shown in FIG. 1, the memory unit 95 includes a memory region 80, an X decoder 81, a Y decoder 82, a write/read control circuit 83, and a source line control circuit 84. The memory unit 95 is an EEPROM (Erasable Programmable Read Only Memory) and capable of erasing stored data at once. Data stored in a memory cell MC of the memory unit 95 is erased at once by controlling a potential of a source line.

The memory region 80 includes a plurality of nonvolatile memory cells MC which are disposed in a matrix arrangement. The write/read control circuit 83 writes data to a predetermined memory cell MC having a predetermined address by controlling the X decoder 81 and Y decoder 82 based on an address data transferred from an address hold circuit 91 (see FIG. 1). In a same way, the write/read control circuit 83 reads out data from a predetermined memory cell MC. The source line control circuit 84 controls a potential level of a source line 87 to erase data stored in the memory cell MC. Note that a configuration of the memory unit is arbitrary.

As shown in FIG. 1, the memory region 80 includes a plurality of memory cells MC disposed in a matrix arrangement. Note that FIG. 2 may be appropriately used for explaining the memory region 80 hereinafter.

Gate electrodes 71 of the memory cells MC aligned in a same line are connected to a common word line 86. Drain regions 75 of the memory cells MC aligned in a same column are connected to a common bit line 85. Source regions 74 of the memory cells MC aligned in a same column are connected to a common source line 87.

Each of the word lines 86 is connected to the X decoder 81. Each of the bit lines 85 is connected to the Y decoder 82. A predetermined voltage is applied to each word line 86 selected by the X decoder 81. In a same way, a predetermined voltage is applied to each bit line 85 selected by the Y decoder 82. Then, data is written to each memory cell MC having an address designated by the X decoder 81 and Y decoder 82.

When charge carriers are injected to a floating gate 72 of each memory cell MC, a forward voltage is applied between a drain and a source of the memory cell MC. More specifically, the source region 74 is grounded, and the gate electrode 71 and the drain region 75 are set to be high in potential. In this case, the source line 87 is grounded, and the bit line 85 and the word line 86 are set to be high in potential.

When charge carriers are released from the floating gate 72 of each memory cell MC, a forward voltage is applied between a source and a gate of the memory cell MC. More specifically, the source region 74 is set to be high in potential, and the gate electrode 71 is grounded. In this case, the source line 87 is set to be high in potential, and the word line 86 is grounded. The bit lines may be set to a floating state.

Data (Bit data) is written to the memory cell MC by storing the charge carriers in the floating gate 72. Data (Bit data) is erased from the memory cell MC by discharging the charge carriers stored in the floating gate 72. Note that the charge carriers are stored in the floating gate even after a power supply to the semiconductor integrated circuit 100 is shut off, thereby realizing the nonvolatile characteristic of the memory unit 95.

Note that the memory region 80 may be divided into a plurality of sectors and the data write and erase processings may be performed for each sector. In this case, it is preferable to prepare the sectors having a same number of the memory cells MC.

As shown in FIG. 2, each memory cell MC 70 includes a P-type semiconductor substrate 76, the N-type drain region 75, the source region 74. The N-type drain region 75 and the source region 74 are formed at a main surface of the P-type semiconductor substrate 76. An oxide layer 73 is formed on the main surface of the semiconductor substrate 76. The floating gate 72 is formed on the oxide layer 73. The gate electrode 71 is formed on the floating gate 72 via an oxide layer (not shown). Each memory cell MC 70 includes the common source region 74 or the common drain region 75. Therefore, the writing processing to write data to a specific memory cell 70 may result in a change in a data value stored in other memory cells 70.

As shown in FIG. 1, the control unit 96 includes a memory control circuit 90, the address hold circuit 91, a write data hold circuit 92, and a determination data hold circuit 93. The control unit 96 outputs write data that is to be written to the memory unit 95. The control unit 96 determines whether readout data from the memory unit 95 matches the write data. Note that the memory control circuit 90, the address hold circuit 91, the write data hold circuit 92, and the determination data hold circuit 93 are coupled to the CPU 97 via the bus 98 and operate based on various control signals transmitted from the CPU 97.

An output of the write data hold circuit 92 is connected to an input a of the memory control circuit 90. An output c of the memory control circuit 90 is connected to the memory unit 95. An output of the memory unit 95 is connected to an input b of the memory control circuit 90. An output d of the memory control circuit 90 is connected to the determination data hold circuit 93. Note that an output of the address hold circuit 91 is connected to the memory unit 95.

The write data hold circuit 92 holds parallel write data WS which is to be written to the memory cells. This parallel write data WS may be appropriately referred to as parallel expectation value data. The CPU 97 controls the write data hold circuit 92 to output the predetermined parallel write data WS to the memory control circuit 90 at a predetermined timing. The parallel write data WS is formed from 8 bit digital values (WS1 to WS8) having an expectation value. In other words, the parallel write data WS is formed from 8 bit expectation value signals.

The determination data hold circuit 93 holds a determination signal JS which is more specifically explained below.

The address hold circuit 91 holds address data for selecting a memory cell MC to which the parallel write data (parallel expectation value data) is to be written. The CPU 97 controls the address hold circuit 91 to output the predetermined address data to the memory unit 95 at a predetermined timing.

The memory control circuit 90 outputs the parallel write data WS to the memory unit 95. The memory control circuit 90 determines whether parallel readout data RS, which is read out from the memory unit 95, matches the parallel write data WS. The parallel readout data RS is 8 bit data and formed from 8 bit digital values (RS1 to RS8). In other words, the parallel readout data RS is formed from 8 bit readout signals.

FIG. 3 shows a schematic block diagram of the memory control circuit 90. As shown in FIG. 3, the memory control circuit 90 includes a parallel data selection circuit (selection circuit) 1, a parallel write data hold circuit (hold circuit) 2, a parallel rewrite data generation circuit (generation circuit) 3, a parallel rewrite data hold circuit (hold circuit) 4, a parallel readout data conversion circuit (conversion circuit) 5, and a determination circuit 6.

An input a of the parallel data selection circuit 1 is connected to an output of the parallel rewrite data hold circuit 4, and an input b of the parallel data selection circuit 1 is connected to an output of the rewrite data hold circuit 92. An output c of the parallel data selection circuit 1 is connected to an input of the parallel rewrite data hold circuit 2. An output of the parallel rewrite data hold circuit 2 is connected to an input of the memory unit 95. An input a of the parallel rewrite data generation circuit 3 is connected to an output of the memory unit 95, and an input b of the parallel rewrite data generation circuit 3 is connected to an output of the parallel rewrite data hold circuit 2.

An output c of the parallel rewrite data generation circuit 3 is connected to an input of the parallel rewrite data hold circuit 4. An output of the parallel rewrite data hold circuit 4 is connected to an input a of the parallel readout data conversion circuit 5. An input a of the parallel readout data conversion circuit 5 is connected to the output of the parallel rewrite data hold circuit 4, an input b of the parallel readout data conversion circuit 5 is connected to the output of the write data hold circuit 92, and an input c of the parallel readout data conversion circuit 5 is connected to the output of the memory unit 95. An output d of the parallel readout data conversion circuit 5 is connected to an input a of the determination circuit 6. The output of the write data hold circuit 92 is connected to an input b of the determination circuit 6. An output of the determination circuit 6 is connected to the output d of the memory control circuit 90. Note that these connections are realized via 8 bit busses.

The parallel data selection circuit 1 outputs data input to the input a or b thereof based on a select signal transmitted from the CPU 97. The 8 bit parallel write data WS is input to the input b of the parallel data selection circuit 1 from the write data hold circuit 92. Parallel rewrite data gWS is input to the input a of the parallel data selection circuit 1 from the parallel rewrite data hold circuit 4. Note that the parallel rewrite data gWS is to be rewritten to the memory cells MC of the memory unit 95 and is formed from 8 bit digital value (gWS1 to gWS8). In other words, the parallel rewrite data gWS is formed from 8 bit rewrite signals.

At a first write processing, the parallel data selection circuit 1 selects the parallel write data WS input to the input b thereof and outputs the data from the output c. At a second rewrite processing after determining that the first write processing is failed, the parallel data selection circuit 1 selects the parallel rewrite data gWS input to the input a thereof and outputs the data from the output c thereof. A configuration and an operation of the parallel data selection circuit 1 are described in detail below.

The parallel write data hold circuit 2 holds parallel data to be written to the memory cells MC. The parallel write data hold circuit 2 is a line memory capable of storing 8 bit digital values. The parallel write data hold circuit 2 holds parallel data sWS output from the parallel data selection circuit 1 and outputs the parallel data sWS.

The parallel rewrite data generation circuit 3 generates the parallel rewrite data gWS based on the data input to the inputs a and b thereof. Note that the parallel readout data RS output from the memory unit 95 is input to the input a of the parallel rewrite data generation circuit 3. The parallel data sWS output from the parallel write data hold circuit 2 is input to the input b of the parallel rewrite data generation circuit 3.

When the first readout processing is performed to readout data from the memory cells, the parallel rewrite data generation circuit 3 generated the above-mentioned parallel rewrite data gWS. Note that a configuration and an operation of the parallel rewrite data generation circuit 3 follows below in detail.

The parallel rewrite data hold circuit 4 holds the above-mentioned parallel rewrite data gWS and outputs this data. The parallel rewrite data hold circuit 4 is a line memory capable of holding 8 bit digital values.

The parallel readout data conversion circuit 5 generates parallel readout data for determination gRS based on the input data input to the inputs a to c thereof.

At a first data readout processing, the parallel readout data conversion circuit 5 outputs the parallel readout data RS, which is output from the memory unit 95, to the input a of the determination circuit 6 as the parallel readout data for determination gWS. If the first determination processing is failed, then a second data write processing is performed. The parallel readout data conversion circuit 5 operates as follows, when the parallel readout data read out from memory cells MC, where it is determined that the readout data matches the write data at the first determination processing, is different from the parallel write data at the second readout processing.

That is, the parallel readout data conversion circuit 5 inverts the bit value of the data read out from the memory cell for setting the bit value equal to the corresponding expectation value. In other words, the parallel readout data conversion circuit 5 set the parallel readout data read out from the memory cells MC to be the corresponding parallel write data formed of the expectation values. The parallel readout data conversion circuit 5 outputs parallel readout data cRS, which is obtained by converting the parallel readout data RS, as the parallel readout data for determination gRS.

As a result, the result of the determination as to whether the parallel readout data matches the parallel expectation value data is prevented from being overturned due to the inversion of the readout digital value included in the parallel readout data at the second determination processing. In other words, the overturn of the determination result is suppressed without deteriorating the reliability of the nonvolatile memory.

Note that the reliability of the nonvolatile memory is sufficiently secured at other reliability tests. The configuration and the operation of the parallel readout data conversion circuit 5 are described in detail below.

The determination circuit 6 determines whether the parallel readout data for determination gRS input to the input a thereof matches the parallel write data WS input to the input b thereof. Note that the parallel readout data for determination gRS is equal to the parallel readout data RS or the converted parallel readout data cRS. If the parallel readout data for determination gRS matches the parallel write data WS, the determination circuit 6 outputs a digital signal "1". If the parallel readout data for determination gRS is different from the parallel write data WS, the determination circuit 6 outputs a digital signal "0". This digital value output from the determination circuit 6 is stored in the determination data hold circuit 93.

Here, a schematic circuit diagram of the above-mentioned parallel data selection circuit 1 is shown in FIG. 4. A schematic circuit diagram of the above-mentioned parallel rewrite data generation circuit 3 is shown in FIG. 5. A schematic circuit diagram of the above-mentioned parallel readout conversion circuit 5 is shown in FIG. 6. A truth table of the parallel rewrite data generation circuit 3 is shown in FIG. 7. A truth table of the parallel readout data conversion circuit 5 is shown in FIG. 8.

Hereinafter, it is assumed that the write processing against a specific memory cell MC is not performed if a corresponding bit included in the write data (the expectation value data) is "1", and the write processing to a specific memory cell MC is performed if a corresponding bit included in the write data (the expectation value data) is "0". It is also assumed that the write processing to a specific memory cell MC is performed successfully if the corresponding digital value included in the readout data is "0", and the write processing to a specific memory cell MC is performed unsuccessfully if the corresponding digital value included in the readout data is "1". Further, it is assumed that if the write processing to the specific memory cell MC is performed successfully, the charge carriers are stored in the floating gate 72 of the specific memory cell MC.

As shown in FIG. 4, the parallel data selection circuit 1 has eight selection circuits 11 to 18 corresponding to each bus width. If the select signal is LOW, the parallel data selection circuit 1 outputs the parallel write data WS as the parallel selected data sWS. If the select signal is HIGH, the parallel data selection circuit 1 outputs the parallel rewrite data gWS as the parallel selected data sWS. Note that the parallel selected data sWS output from the parallel data selection circuit 1 is formed from 8 bit digital values sWS1 to sWS8.

The selection circuit 11 includes an AND circuit 1 (AND1), an AND circuit 2 (AND2), and an OR circuit (OR). The rewrite bit gWS1 output from the parallel rewrite data hold circuit 4 and the select signal are input to the AND circuit 1. The write bit WS1 output from the write data hold circuit 92 and the select signal are input to the AND circuit 2. An output of the AND circuit 1 and an output of the AND circuit 2 are input to the OR circuit. An output of the OR circuit is connected to the parallel rewrite data hold circuit 2. Configurations of other selection circuits 12 to 18 are similar to that of the selection circuit 11, and thus a redundant explanation thereof is omitted.

If the select signal is LOW, the selection circuit 11 outputs the write bit WS1. If the select signal is HIGH, the selection circuit 11 outputs the rewrite bit gWS1. The same explanation can be applied to other selection circuits 12 to 18.

In this way, the parallel data selection circuit 1 outputs the parallel write data WS as the parallel selected data sWS if the select signal is LOW, and outputs the parallel rewrite data gWS as the parallel selected data sWS if the select signal is HIGH.

As shown in FIG. 5, the parallel rewrite data generation circuit 3 includes eight rewrite data generation circuits 21 to 28 corresponding to bus width. As described above, the parallel rewrite data generation circuit 3 generates the parallel rewrite data gWS based on the parallel readout data RS input to the input a thereof and the parallel selected data sWS input to the input b thereof.

The rewrite data generation circuit 21 includes an OR circuit (OR). The readout bit value RS1 readout from a specific memory cell MC is first inverted and then input to the OR circuit. The bit value sWS1 output from the parallel rewrite data hold circuit 2 is also input to the OR circuit. The OR circuit outputs a rewrite bit value gWS1. This rewrite bit value gWS1 is input to the parallel rewrite data hold circuit 4. Configurations of the other rewrite data generation circuits 22 to 28 are similar to that of the rewrite data generation circuit 21, and thus a redundant explanation thereof is omitted.

As shown in FIG. 6, the parallel readout data conversion circuit 5 includes eight readout data conversion circuits 31 to 38 corresponding to the bus width. Note that the parallel readout data conversion circuit 5 generates the parallel readout data for determination gRS which is to be input to the input a of the determination circuit 6 based on the parallel data input to the inputs a to c, as described above.

The readout data conversion circuit 31 includes the AND circuit 1 (AND1), and the AND circuit 2 (AND2). The rewrite bit value gWS1 output from the parallel rewrite data hold circuit 4 is input to the AND circuit 1. The write bit value WS1 is first inverted and then input to the AND circuit 1. The readout bit value RS1 is input to the AND circuit 2. An output of the AND circuit 1 is first inverted and then connected to the AND circuit 2. An output of the AND circuit 2 is connected to the input a of the determination circuit 6. Configurations of the other readout data conversion circuits 32 to 38 are similar to that of the readout data conversion circuit 31, and thus a redundant explanation thereof is omitted.

A truth table of the rewrite data generation circuit 21 is shown in FIG. 7. As shown in FIG. 7, the rewrite data generation circuit 21 set the rewrite bit value gWS1 to "1" in the case where the readout bit value RS1 matches the write bit value WS1 at a specific memory cell MC. That is, the rewrite data generation circuit 21 sets the rewrite bit value so as not to perform rewrite processing to the memory cell MC where the former write processing is determined to be successful. On the other hand, the rewrite data generation circuit 21 sets the rewrite bit value equal to the write bit value in the case where the readout value RS1 is different from the write value WS1.

A truth table of the readout data conversion circuit 31 is shown in FIG. 8. As shown in FIG. 8, the readout data conversion circuit 31 converts RS1=1 to RS=0 when gWS1=1 and WS1=0. In other words, the readout data conversion circuit 31 fixes the readout value RS1 to "0" when the gWS1=1 and WS1=0. Note that, in other cases, gRS1=RS1.

Here, an operation of the memory control circuit 90 is explained with reference to FIGS. 9 to 17.

As described above, it is assumed that the write processing to a specific memory cell MC is not performed if a corresponding bit included in the write data is "1", and the write processing to a specific memory cell MC is performed if a corresponding bit included in the write data is "0". It is also assumed that the write processing to a specific memory cell MC is performed successfully if the corresponding digital value included in the readout data is "0", and the write processing to a specific memory cell MC is performed unsuccessfully if the corresponding digital value included in the readout data is "1". Further, it is assumed that if the write processing to the specific memory cell MC is performed successfully, the charge carriers are stored in the floating gate 72 of the specific memory cell MC.

A schematic flowchart for explaining a method of controlling the nonvolatile memory is shown in FIG. 9. As shown in FIG. 9, first, the parallel write data WS is written to predetermined 8 bit memory cells MC (S1).

As shown in FIG. 10, the parallel expectation value data WS to be written to each memory cell MC is represented as 8 bit digital values "01010101".

In S1, the select signal is LOW as shown in FIG. 11, and the parallel data selection circuit 1 outputs the parallel write data WS equal with the parallel expectation value data without changing values of bits thereof. The parallel write data hold circuit 2 holds the parallel write data WS from the parallel data selection circuit 1 and outputs the held parallel write data WS. Then, the parallel write data WS is output from the output c of the memory control circuit 90.

Then, the parallel write data WS is input to the memory unit 95. In this case, address data is input from the address hold circuit 91 to the 8 bit memory cells MC of the memory unit 95. The memory unit 95 performs write processing to the 8 bit memory cells MC determined based on the input parallel write data WS and the address data from the address hold circuit 91.

After S1, a read processing is performed to read parallel data from the memory cells MC to which the data is written (S2). Then, the parallel readout data RS is input from the memory unit 95 to the input b of the memory control circuit 90. Note that the first parallel readout data RS is represented as 8 bit digital values "01111101".

In S2, the parallel rewrite data generation circuit 3 operates as shown in FIG. 12. That is, the parallel rewrite data generation circuit 3 generates the parallel rewrite data gWS based on the parallel readout data RS and the parallel write data WS. Note that the parallel data input from the parallel write data hold circuit 2 to the parallel rewrite data generation circuit 3 is equal to the parallel write data WS.

The parallel rewrite data generation circuit 3 sets the rewrite value to "1" when the readout value matches the write value. Therefore, it is possible to avoid rewriting of value to a memory cell MC where the value has been written successfully. In addition, it is possible to memorize information of the memory cell where the write processing has been determined to be successful, by setting the rewrite value to "1". In this case, the memory cells MC corresponding to the 3rd and 5th bits of the parallel rewrite data gWS are identified as target memory cells of the rewrite processing and other memory cells MC are not identified as target memory cells of the rewrite processing (the other memory cells MC are identified as MASK in other words).

After S2, a verification processing is performed to determine whether the parallel readout data RS matches the parallel write data (S3).

At this time, the parallel readout data conversion circuit 5 operates as shown in FIG. 13. More specifically, the parallel readout data conversion circuit 5 outputs the parallel readout data RS input to the input c, as the parallel readout data for determination gRS without changing bit values thereof.

Then, the determination circuit 6 outputs the determination signal JS=0, which shows a failure of the write processing, to the determination data hold circuit 93 as shown in FIG. 14. At this time, the write processing to the memory cells MC corresponding to the 3rd and 5th bits of the parallel write data is determined to be failed, and the determination circuit 6 outputs the determination signal JS=0, which shows a failure of the write processing, to the determination data hold circuit 93.

In this way, the first write and determination processings are performed. At this time, the write processing is determined to be unsuccessful, and it is determined whether the number of cycles of the determination processing reaches to a predetermined maxim number (S4) after the S3. This cycle is a first time; therefore the flow returns to S1 to perform the write processing again.

At the second write processing, the parallel rewrite data gWS held by the parallel rewrite data hold circuit 4 is written to the memory cells MC. Note that the select signal is switched from LOW to HIGH by the CPU 11 before S1 for the second time. Then, the parallel rewrite data gWS is output from the parallel data selection circuit 1 as shown in FIG. 11.

Then, the parallel write data hold circuit 2 holds the parallel rewrite data gWS output from the parallel data selection circuit 1 and outputs the held parallel rewrite data gWS. The parallel rewrite data gWS is output from the output c of the memory control circuit 90. The rewrite data gWS is input to the memory unit 95. In the same manner as the first time, the memory unit 95 performs the rewrite operation to the 8 bit memory cells based on the input parallel rewrite data gWS and the address data (S1). Note that the rewrite processing is performed only against the memory cells corresponding to the 3rd and 5th bits of the parallel rewrite data.

After the execution of S1 for the second time, the read processing is performed to read out the data from the memory cells MC where the data is written by the write processing (S2). The parallel readout data RS read out from the memory cells MC is input to the input b of the memory control circuit 90 from the memory unit 95. As shown in FIG. 10, the parallel readout data RS is represented as 8 bit digital values "01010111".

As apparent from the FIG. 10, the readout values corresponding to the 3rd and 5th bits match the corresponding write values respectively. Note that the readout value corresponding to the 7th bit is changed from "0" to "1" where the first write processing has been determined to be successful.

In the execution of S2 for the second time, the parallel rewrite data generation circuit 3 operates as shown in FIG. 15. That is, as shown in FIG. 15, the parallel rewrite data generation circuit 3 generates the parallel rewrite data gWs again based on the parallel readout data RS and the first parallel rewrite data gWS. In a similar manner as described above, the parallel rewrite data generation circuit 3 sets the write value to "1" when the read value matches the write value (expectation value). The rewrite processing to the memory cells corresponding the 3rd and 5th bits are determined to be successful. Therefore, parallel rewrite data gWS of "11111111" is regenerated so as to prevent a third write processing from being executed. The regenerated parallel rewrite data gWS of "11111111" may be recognized as an end signal showing the end of the write processing. In other words, the parallel rewrite data gWS of "11111111" may be recognized as a rewrite processing end signal.

After the execution of S2 for the second time, the verification processing is performed so as to determine whether the parallel readout data RS matches the parallel write data WS (S3). In this embodiment, the parallel readout data conversion circuit 5 operates as shown in FIG. 16. That is, the parallel readout data conversion circuit 5 inverts a value of 7th bit of the parallel readout data RS1 which is determined to equal with the corresponding expectation value at the determination processing for the first time. Then, the parallel readout data conversion circuit 5 outputs the converted parallel readout data cRS "01010101" shown in FIG. 10 as the parallel readout data for determination gRS.

The determination circuit 6 operates as shown in FIG. 17. More specifically, the determination circuit 6 determines whether the parallel readout data for determination gRS (converted parallel readout data cRS) output from the parallel readout data conversion circuit 5 matches the parallel write data WS (the parallel expectation value data WS). In this case, all the bits of the parallel readout data for determination gRS match the corresponding bit values of the parallel write data WS respectively. Therefore, the determination circuit 6 outputs the determination signal JS=1 showing that the write processing has done successfully to the determination data hold circuit 93.

In this way, the second write and determination processings are performed. Since the second write processing is determined to be successful at the second determination processing, the write and determination processings for the target 8 bit memory cells MC end. Note that if the number of the determination processings reaches the predetermined maximum number, the rewrite processing is determined to be failed (NG) and these processings end. In the case where the write processing is determined to be failed, the semiconductor integrated circuit to be processed is determined to be defective. Note that the predetermined maximum number is arbitrary.

As apparent from the above explanations, in this embodiment, the subsequent determination processing for a memory cell MC, where the former write processing is determined to be successful at the former determination processing, is performed after setting a readout value to an expectation value even though the readout value becomes different from the expectation value. As a result, it is possible to prevent the determination result from being overturned due to the inversion of the readout data value without deteriorating the reliability of the nonvolatile memory.

In this embodiment also disclosed is a memory control circuit comprising: a write data generation circuit generating second write data for a subsequent write processing by changing a logical value of bit, which is successfully written to a memory cell of a memory, based on first write data used in a former write processing and a readout data read out from a predetermined region of the memory on which the former write processing is performed for writing the first write data; a verify data generation circuit generating verify data by identifying a bit having a second logical value from the second write data, the bit having the second logical value corresponding to a bit having a first logical value of expectation value data that is expected to be stored in the memory and formed from expectation values, and setting the identified bit of the readout data to be equal to the corresponding expectation value; and a verify determination circuit comparing the verify data with the expectation value data. It is preferable that the second write data is set so as not to write once again the expectation value to the memory cell that is previously determined to be storing the expectation value successfully.

The present invention is not limited to the above embodiment. The write processing is not necessarily performed by 8 bit but may be performed by 32, 64, or 128 bits. A specific configuration of the memory cell MC is arbitrary. A specific configuration of the memory control circuit 90 is arbitrary. A specific configuration of the nonvolatile memory is also arbitrary.

It is apparent that the present invention is not limited to the above embodiment but may be modified and changed without departing from the scope and spirit of the invention.

What is claimed is:
1. A memory control circuit comprising:
a conversion circuit performing a conversion processing for parallel readout bit data formed from individual bits read out from memory cells of a nonvolatile memory, by setting an individual bit of the individual bits that is read out from a memory cell among the memory cells to a corresponding expectation value expected to be stored in the memory cell when the memory cell is determined, prior to the conversion processing, to be successfully storing the individual bit as an expectation value; and a determination circuit determining a result of a write processing to write parallel expectation value data to the nonvolatile memory, based on the parallel readout bit data converted by the conversion circuit and the parallel expectation value data.

2. The memory control circuit according to claim 1, further comprising:
a parallel rewrite data generation circuit generating parallel rewrite data which is set to not write again the expectation value to the memory cell that is determined, previous to the generating of the parallel rewrite data, to be storing the expectation value successfully.

3. The memory control circuit according to claim 2, wherein the conversion circuit detects the memory cell already determined to be storing the expectation value successfully based on the parallel rewrite data.

4. The memory control circuit according to claim 2, further comprising:
a first hold circuit holding the parallel rewrite data; and
a second hold circuit holding the parallel rewrite data transferred from the first hold circuit.

5. The memory control circuit according to claim 4, wherein the conversion circuit sets a readout value that is read out from the memory cell, which is determined to be storing the expectation value successfully, to the expectation value expected to be stored in the memory cell, based on the parallel rewrite data stored at least in the first hold circuit.

6. The memory control circuit according to claim 5, further comprising:
a parallel data selection circuit selecting and outputting one of the parallel expectation value data and the parallel rewrite data stored in the first hold circuit, to the second hold circuit based on a select signal.

7. The memory control circuit according to claim 6, wherein the parallel expectation value data is stored in the second hold circuit when the parallel rewrite data stored in the first hold circuit shows an end of the write processing.

8. The memory control circuit according to claim 4, wherein the parallel expectation value data is connected to the second hold circuit from outside of the memory control circuit.

9. The memory control circuit according to claim 2, wherein the conversion circuit generates parallel readout data for determination by the determination circuit based on a first input from the memory cells, a second input receiving the parallel rewrite data held by a parallel rewrite data hold circuit, and a third input receiving parallel data to be written to the memory cells from a parallel write data hold circuit,
wherein the determination circuit determines the write processing to write parallel expectation value data to a specific location of the individual bit read from the nonvolatile memory when a read value of the individual bit corresponds to the expectation value of write data expected to be stored in the memory cell, and
wherein the expectation value data comprises write data written to the nonvolatile memory.

10. The memory control circuit according to claim 1, further comprising:
a parallel rewrite data generation circuit generating parallel rewrite data which is set to write the expectation value only to the memory cell that is determined to be not storing the expectation value successfully.

11. The memory control circuit according to claim 10, wherein the conversion circuit identifies the memory cell determined to be not storing the expectation value successfully based on the parallel rewrite data.

12. The memory control circuit according to claim 1, wherein the conversion circuit sets a read value of the individual bit that is read out from the memory cell, which is determined already to be successfully storing the expectation value of write data, to a corresponding parallel write value comprising the expectation value expected to be stored in the memory cell.

13. The memory control circuit according to claim 1, wherein the expectation value is a value expected to be eventually stored in the memory cell according to write processing to write parallel expectation value data to the nonvolatile memory.

14. The memory control circuit according to claim 1, wherein the conversion circuit sets the parallel readout bit data read out from the memory cells to be a corresponding parallel write data formed of a plurality of the expectation values to suppress a change of the individual bits determined to be successfully stored in the memory cells.

15. The memory control circuit according to claim 1, wherein the conversion circuit outputs the parallel readout bit data to the determination circuit for a first determination processing to compare the parallel readout bit data with the parallel expectation value from the write processing to provide a first determination result, and
wherein the conversion circuit performs the conversion by setting the individual bit, determined during the first determination processing as successfully being stored in the memory cell, to the corresponding expectation value from the write processing to suppress a change of the first determination result during a second determination processing, the second determination processing being performed subsequent to the first determination processing by the determination circuit.

16. The memory control circuit according to claim 1, wherein in a verification of data writing to the nonvolatile memory by the conversion circuit and the determination circuit, when the verification of the data writing is carried out again after a previous writing verification has failed, all of the memory cells other than memory cells for which the verification has failed, are judged as successfully storing an expectation value and thereby determined by the determination circuit to be normally functioning in subsequent writing verifications.

17. A semiconductor integrated circuit comprising:
a nonvolatile memory storing parallel bit data formed from individual bits based on parallel expectation value data that is expected to be stored in the nonvolatile memory and formed from expectation values; and
a memory control circuit checking whether the parallel expectation value data is stored in the nonvolatile memory successfully, the memory control circuit including:
a conversion circuit converting parallel readout bit data formed from individual bits read out from memory cells of a nonvolatile memory, by setting an individual bit that is read out from a memory cell from the memory cells to the corresponding expectation value that is expected to be stored in the one of the memory cells when the one of the memory cells is determined, prior to the conversion processing, to be successfully storing the individual bit as the expectation value; and
a determination circuit determining a result of a write processing to write parallel expectation value data to the nonvolatile memory, based on the parallel readout bit data converted by the conversion circuit and the parallel expectation value data.

18. The semiconductor integrated circuit according to claim 17, further comprising:
a parallel rewrite data generation circuit generating parallel rewrite data which is set to not write the expectation value to the memory cell that is already determined to be storing the expectation value successfully.

19. The semiconductor integrated circuit according to claim 18, wherein the conversion circuit detects the memory cell determined to be storing the expectation value successfully based on the parallel rewrite data.

20. The semiconductor integrated circuit according to claim 18, further comprising:
a first hold circuit holding the parallel rewrite data; and
a second hold circuit holding the parallel rewrite data transferred from the first hold circuit.

21. The semiconductor integrated circuit according to claim 20, wherein the conversion circuit sets a readout value that is once again read out from the memory cell, which is determined to be storing the expectation value successfully, to the expectation value expected to be stored in the memory cell, based on the parallel rewrite data stored at least in the first hold circuit.

22. The semiconductor integrated circuit according to claim 21, further comprising:
a parallel data selection circuit selecting and outputting one of the parallel expectation value data and the parallel rewrite data stored in the first hold circuit, to the second hold circuit based on a select signal.

23. The semiconductor integrated circuit according to claim 22, wherein the parallel expectation value data is stored in the second hold circuit when the parallel rewrite data stored in the first hold circuit shows an end of the write processing.

24. The semiconductor integrated circuit according to claim 17, further comprising:
a parallel rewrite data generation circuit generating parallel rewrite data which is set to write the expectation value only to the memory cell that is already determined to be not storing the expectation value successfully.

25. A verification method of a nonvolatile memory comprising:
converting parallel readout bit data formed from individual bits read out from memory cells of a nonvolatile memory, by setting an individual bit of the individual bits that is read out from a memory cell from among the memory cells to a corresponding expectation value that is expected to be stored in the memory cell when the memory cell is determined, prior to the converting, to be successfully storing the individual bit as an expectation value; and
determining a result of a write processing to write parallel expectation value data to the nonvolatile memory, based on the parallel readout bit data converted by the conversion circuit and the parallel expectation value data.

26. The verification method of a nonvolatile memory according to claim 25 further comprising:
writing the expectation value only to the memory cell that is determined to be not storing the expectation value successfully, when the parallel expectation value data is once again written to the plurality of memory cells after a write processing is determined as a failure.

* * * * *